United States Patent
Caldwell et al.

(10) Patent No.: US 11,469,575 B2
(45) Date of Patent: Oct. 11, 2022

(54) AIRFLOW CHANNEL POWER DISTRIBUTION EQUIPMENT CABINET

(71) Applicant: Vertiv Corporation, Columbus, OH (US)

(72) Inventors: Carl Caldwell, Cardington, OH (US); Ian G. Spearing, Westerville, OH (US)

(73) Assignee: Vertiv Corporation, Columbus, OH (US)

( * ) Notice: Subject to any disclaimer, the term of this patent is extended or adjusted under 35 U.S.C. 154(b) by 0 days.

(21) Appl. No.: 17/154,364

(22) Filed: Jan. 21, 2021

(65) Prior Publication Data

US 2021/0235598 A1 Jul. 29, 2021

Related U.S. Application Data

(60) Provisional application No. 62/964,896, filed on Jan. 23, 2020.

(51) Int. Cl.
*H05K 7/20* (2006.01)
*H02B 1/56* (2006.01)

(52) U.S. Cl.
CPC ......... *H02B 1/565* (2013.01); *H05K 7/20127* (2013.01); *H05K 7/20145* (2013.01); *H05K 7/20572* (2013.01)

(58) Field of Classification Search
CPC ........... H05K 7/20127; H05K 7/20545; H05K 7/20145; H02B 1/56; H02B 1/565
See application file for complete search history.

(56) References Cited

U.S. PATENT DOCUMENTS

| | | | |
|---|---|---|---|
| 5,657,641 A | | 8/1997 | Cunningham et al. |
| 6,104,003 A | * | 8/2000 | Jones ............... H05K 7/207 219/400 |
| 6,400,567 B1 | * | 6/2002 | McKeen ............ H05K 7/20145 361/695 |

(Continued)

FOREIGN PATENT DOCUMENTS

CN          101582566          * 11/2009

OTHER PUBLICATIONS

International Search Report and Written Opinion regarding International Application No. PCT/US2021/014555, dated Apr. 22, 2021.

*Primary Examiner* — Zachary Pape
(74) *Attorney, Agent, or Firm* — Harness, Dickey & Pierce, P.L.C.

(57) ABSTRACT

A power distribution cabinet is disclosed which includes multiple internal compartments for separating and channeling hot air generated by high heat generating components out of the cabinet without coming into contact with more heat sensitive components. The cabinet includes a baffle structure which forms an internal wall within the cabinet, which helps to form a high heat compartment and an upper compartment. The high heat compartment houses a heat generating component. Cool air is allowed to flow into a lower area of the cabinet and into the high heat compartment, and is also channeled into the upper compartment where at least one other heat generating component is located. The baffle structure channels hot air formed within the high heat compartment out toward a rear area of the equipment cabinet, while also helping to channel warm air created within the upper compartment through a top panel of the cabinet.

21 Claims, 4 Drawing Sheets

(56) References Cited

U.S. PATENT DOCUMENTS

| | | | |
|---|---|---|---|
| 8,785,770 B2* | 7/2014 | Gingrich | H02B 1/565 |
| | | | 361/605 |
| 9,888,616 B2* | 2/2018 | Yu | H05K 7/14 |
| 10,617,043 B2* | 4/2020 | Ionescu | H05K 7/20572 |
| 10,629,396 B2* | 4/2020 | Skibinski | H02B 13/025 |
| 2004/0257766 A1 | 12/2004 | Rasmussen et al. | |
| 2019/0037728 A1 | 1/2019 | Roy | |

* cited by examiner

AIRFLOW CHANNEL POWER DISTRIBUTION EQUIPMENT CABINET

CROSS-REFERENCE TO RELATED APPLICATIONS

This application claims the benefit of U.S. Provisional Application No. 62/964,896, filed on Jan. 23, 2020. The entire disclosure of the above application is incorporated herein by reference.

FIELD

The present disclosure relates to equipment cabinets, and more particularly to a power distribution equipment cabinet having multiple distinct airflow compartments and passages formed therein to channel heat produced from high heat generating electrical/electronic components located within the cabinet along a flow path separate from other, lower heat producing components.

BACKGROUND

The statements in this section merely provide background information related to the present disclosure and may not constitute prior art.

Dedicated power distribution equipment cabinets, such as those housing large power transformers, busbars and power distribution circuit breakers, are often used to provide an output to an uninterruptible power supply (UPS) or a power distribution unit (PDU), or to other components. Such cabinets that house one or more large power transformers generate a large quantity of heat. Typically, the cabinet dimensions of such cabinets have been increased such that the internal volume of cabinet is sufficiently large so that the generated heat is dispersed within the cabinet in a manner, and to a degree, to prevent over-heating of other heat sensitive components (e.g., bus bars, breaker panels, electrical cabling, etc.) housed in the cabinet. Of course, this increase in the overall dimensions of the cabinet necessitates enlarging the footprint of the cabinet, which is undesirable for a number of reasons. One important reason is that the larger the equipment cabinet, the less floor space is available in the data center for other components. Another reason is that the larger the cabinet needs to be made to make sure various internal, heat sensitive components do not experience excessive heat, the more expensive and heavy the cabinet becomes. The larger and heavier the cabinet is, generally the more costly the packaging and shipping of the cabinet to the installation site becomes.

Accordingly, there is a strong interest in providing a power distribution cabinet design which can better accommodate and route the hot air generated by large power transformers or other high heat generating components out of the cabinet, while keeping other heat sensitive components clear of the hot air flow, and while reducing the overall footprint and overall dimensions of the cabinet.

SUMMARY

This section provides a general summary of the disclosure, and is not a comprehensive disclosure of its full scope or all of its features.

In one aspect the present disclosure relates to an equipment cabinet. The equipment cabinet may comprise a frame and a plurality of exterior panels. The exterior panels may include first and second side panels, and a rear panel, all supported from the frame in vertical orientations to help define an interior area within the equipment cabinet. The rear panel may have an opening at an upper end thereof for enabling hot air within the interior area of the equipment cabinet to be expelled from the equipment cabinet. At least one top panel may be included for covering at least a major portion of the equipment cabinet. The top panel may include an opening to expel warm air from within the interior area to an ambient environment outside the equipment cabinet. At least one front door may be included which is movable between open and closed orientations to enable access to the interior area of the equipment cabinet. At least one of the front door panel or the rear panel may include a cool air opening for enabling cool air to enter the interior area of the equipment cabinet and flow into a lower cool air intake compartment of the equipment cabinet. A baffle structure may be included which is disposed within the interior area of the equipment cabinet, and which extends laterally between the first and second side panels. The baffle structure may form a barrier that creates a high heat compartment separated from an upper compartment within the interior area of the equipment cabinet. The baffle structure may further be configured to channel the hot air generated from an electrical component housed in the high heat compartment upwardly and toward the opening at the upper end of the rear panel, to be expelled through the opening at the upper end of the rear panel to the ambient environment outside the equipment cabinet. The upper compartment may operate to channel the warm air created from an additional electrical component housed in the upper compartment, through the opening in the at least one top panel, to the ambient environment outside the equipment cabinet.

In another aspect the present disclosure relates to an equipment cabinet. The equipment cabinet may comprise a frame and a plurality of exterior panels. The exterior panels may include first and second side panels and a rear panel supported from the frame in vertical orientations to help define an interior area within the equipment cabinet. The rear panel may have an opening at an upper end thereof for enabling hot air within the interior area of the cabinet to be expelled from the cabinet. At least one top panel may be included for covering at least a major portion of the equipment cabinet, with the top panel including an opening to expel warm air from within the interior area to an ambient environment outside the equipment cabinet. At least one front door may be included which is movable between open and closed orientations to enable access to an interior area of the equipment cabinet. Both of the front door panel and the rear panel may include cool air openings for enabling cool air to enter the interior area of the equipment cabinet at a lower area of the equipment cabinet, and to flow into a lower cool air intake compartment within the equipment cabinet. The equipment cabinet may also include a baffle structure disposed within the interior area thereof, and which extends laterally between the first and second side panels. The baffle structure may include at least one section operating to form a barrier that creates a high heat compartment separated from an upper compartment within the interior area of the equipment cabinet. The baffle structure also helps to form the lower cool air intake compartment at the lower area of the equipment cabinet, below the high heat compartment, from which cool air is able to enter the high heat compartment at the lower area of the equipment cabinet, and from which cool air is able to flow upwardly into the upper compartment. The baffle structure may be configured to channel the hot air generated from an electrical component housed in the high heat compartment upwardly and toward the opening at the upper end of the rear panel, to be expelled through the opening at the upper end of the rear panel to the ambient environment outside the equipment cabinet. The upper compartment may operate to channel the warm air created from an additional electrical component housed in the upper compartment, through the opening in the at least one top panel, to the ambient environment outside the equipment cabinet.

In still another aspect the present disclosure relates to a method for forming an equipment cabinet. The method may comprise providing a frame and using a plurality of exterior panels including first and second side panels, and a rear panel, supported from the frame in vertical orientations, to help define an interior area within the equipment cabinet. The rear panel may have an opening at an upper end thereof for enabling hot air within the interior area of the cabinet to be expelled from the cabinet. The method may further include using at least one top panel to cover at least a major portion of the equipment cabinet, and providing the top panel with an opening to expel warm air from within the interior area to an ambient environment outside the equipment cabinet. The method may further include disposing at least one front door from the frame which is movable between open and closed orientations to enable access to an interior area of the equipment cabinet. The method may further include providing at least one of the front door panel or the rear panel with a cool air opening for enabling cool air to enter a lower cool air intake compartment area within the equipment cabinet, and disposing a baffle structure within the interior area of the equipment cabinet, and such that the baffle structure extends laterally between the first and second side panels. The method may further include providing the baffle structure with at least one section operating to form a barrier that creates a high heat compartment separated from an upper compartment within the interior area of the equipment cabinet. The method may further include further configuring the baffle structure to channel the hot air generated from an electrical component housed in the high heat compartment upwardly and toward the opening at the upper end of the rear panel, to be expelled through the opening at the upper end of the rear panel to the ambient environment outside the equipment cabinet. The method may further include configuring the upper compartment to channel the warm air created from an additional electrical component housed in the upper compartment, through the opening in the at least one top panel, to the ambient environment outside the equipment cabinet.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings, in which.

DETAILED DESCRIPTION

Example embodiments will now be described more fully with reference to the accompanying drawings.

Figure 1:
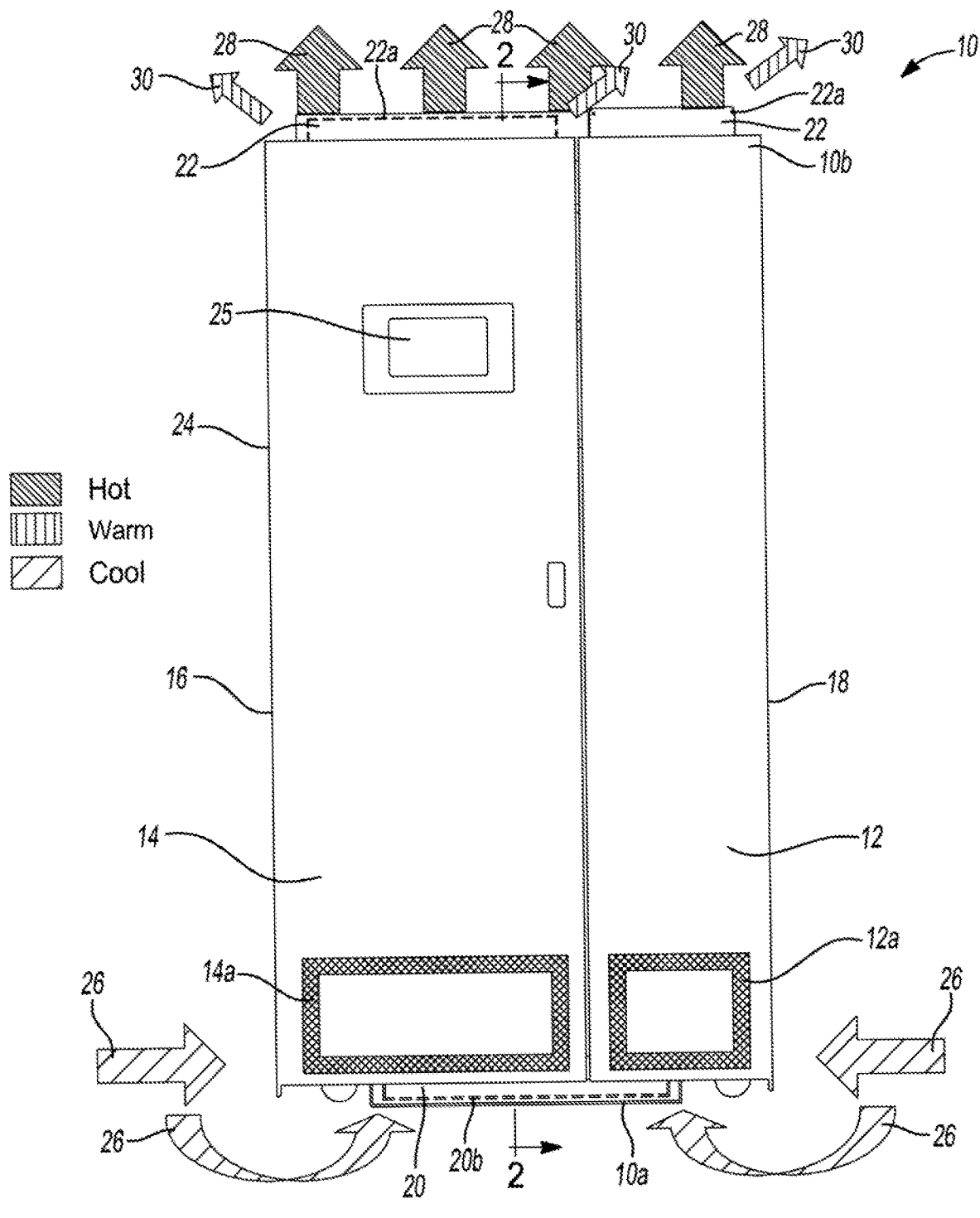
FIG. 1 is a front view of one embodiment of a power distribution cabinet in accordance with the present disclosure.

Referring to FIG. 1, power distribution equipment cabinet 10 (hereinafter simply "cabinet 10") is shown in accordance with one embodiment of the present disclosure. The cabinet 10 in this example includes a right hand (RH) front door 12, a left hand (LH) front door 14, side panels 16 and 18, a bottom panel 20, top panels 22 and a rear panel 24 (not visible in FIG. 1). The lower portions of LH front door 12 and RH front door 14 may include selectively positioned regions of perforations 12a and 14a or slots or other openings of various shapes which help to allow airflow into the cabinet 10. With brief reference to FIG. 3, a portion of the lower area of the cabinet 10 is shown to be covered by an upper portion 20a of the bottom panel 20. This upper portion 20a of the bottom panel 20 includes a plurality of perforations, slots or other openings 20a1 that extend through the bottom panel 20 to a lower portion 20b of the bottom panel 20 for admitting cool air into the bottom of the cabinet. With brief reference to FIG. 4, a portion of the rear panel 24 is shown. The lower portion of the rear panel 24 preferably includes a plurality of perforations, slots or other openings 24a for admitting cool air into the bottom of the cabinet 10, and the upper portion of the rear panel 24 preferably includes a plurality of additional slots or openings 24b for allowing hot air flow to exit out the rear of the cabinet 10, as will be described in greater detail in the following paragraphs.

Figure 2:
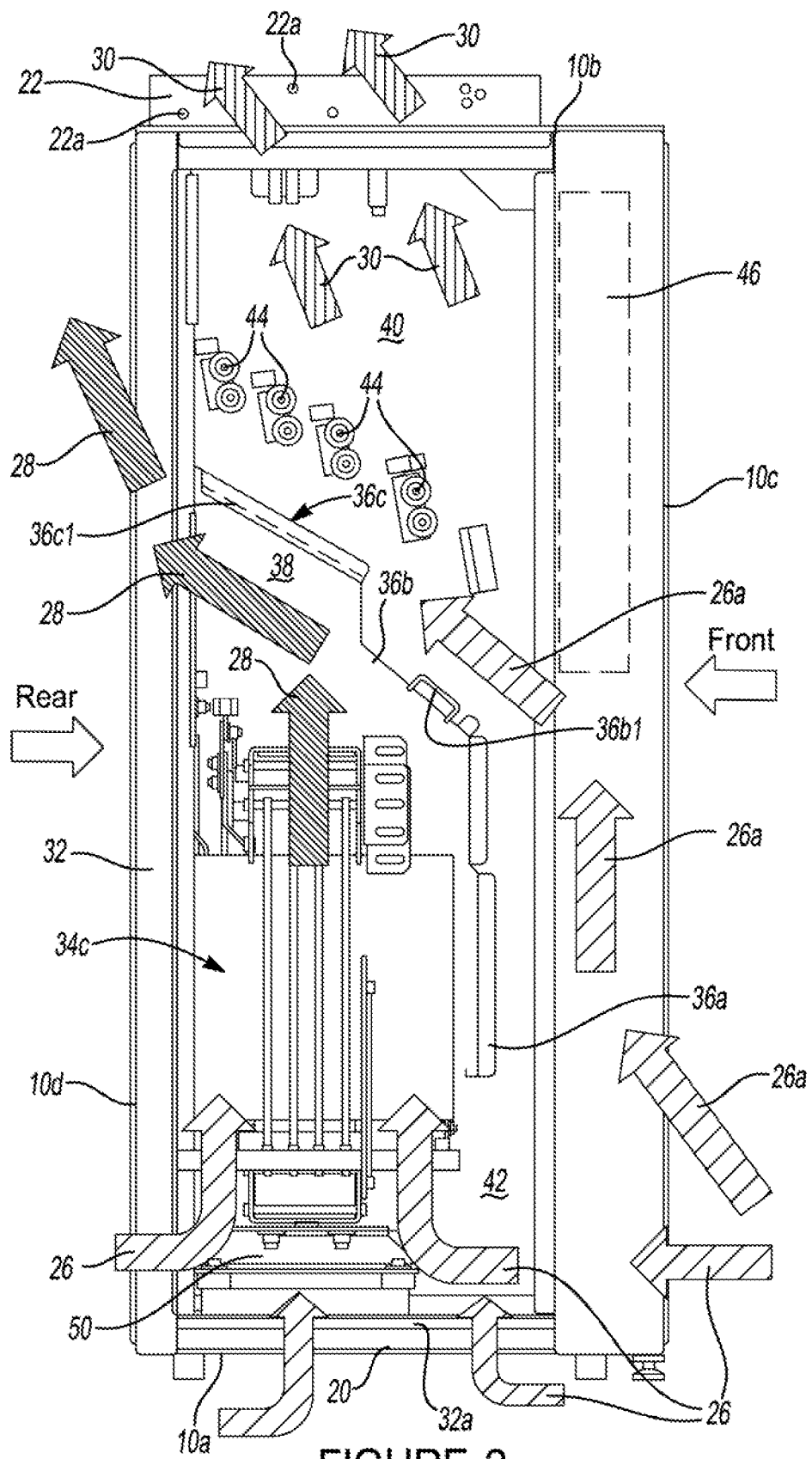
FIG. 2 is a side cross sectional view of the cabinet of FIG. 1 taken in accordance with section line 2-2 in FIG. 1.

Referring to FIGS. 1 and 2, the front and side walls of the top panels 22 may include perforations, slots or other openings 22a to allow warm airflow to exit out from an upper area 10b of the cabinet 10, as will be described in greater detail in the following paragraphs. In some embodiments, either the LH front door 14 or the RH front door 12 may hold a control panel/user interface/display subassembly 25 to enable a user to control or command one or more internal components mounted within the cabinet 10. In this example the control panel/user interface/display subassembly 25 is shown positioned on the LH front door 14, but the subassembly 25 may also be included on the RH front door 12.

FIG. 1 also shows cool air indicated by arrows 26 which enters through openings 24a in the rear panel 24 (shown in FIG. 4) of the cabinet 10, as well as through the openings 20a1 in the bottom panel 20 (shown in FIG. 3) and openings 12a and 14a in the RH and LH front doors 12 and 14, respectively. Hot exhaust air created by one or more large scale power transformers housed within the cabinet 10 is exhausted out behind the rear of the cabinet 10, as indicated by arrows 28. A moderately warm air flow generated by other electrical/electronic components located within the cabinet 10 is also exhausted out through the openings 22a in the top panels 22, as indicated by arrows 30.

Figure 3:
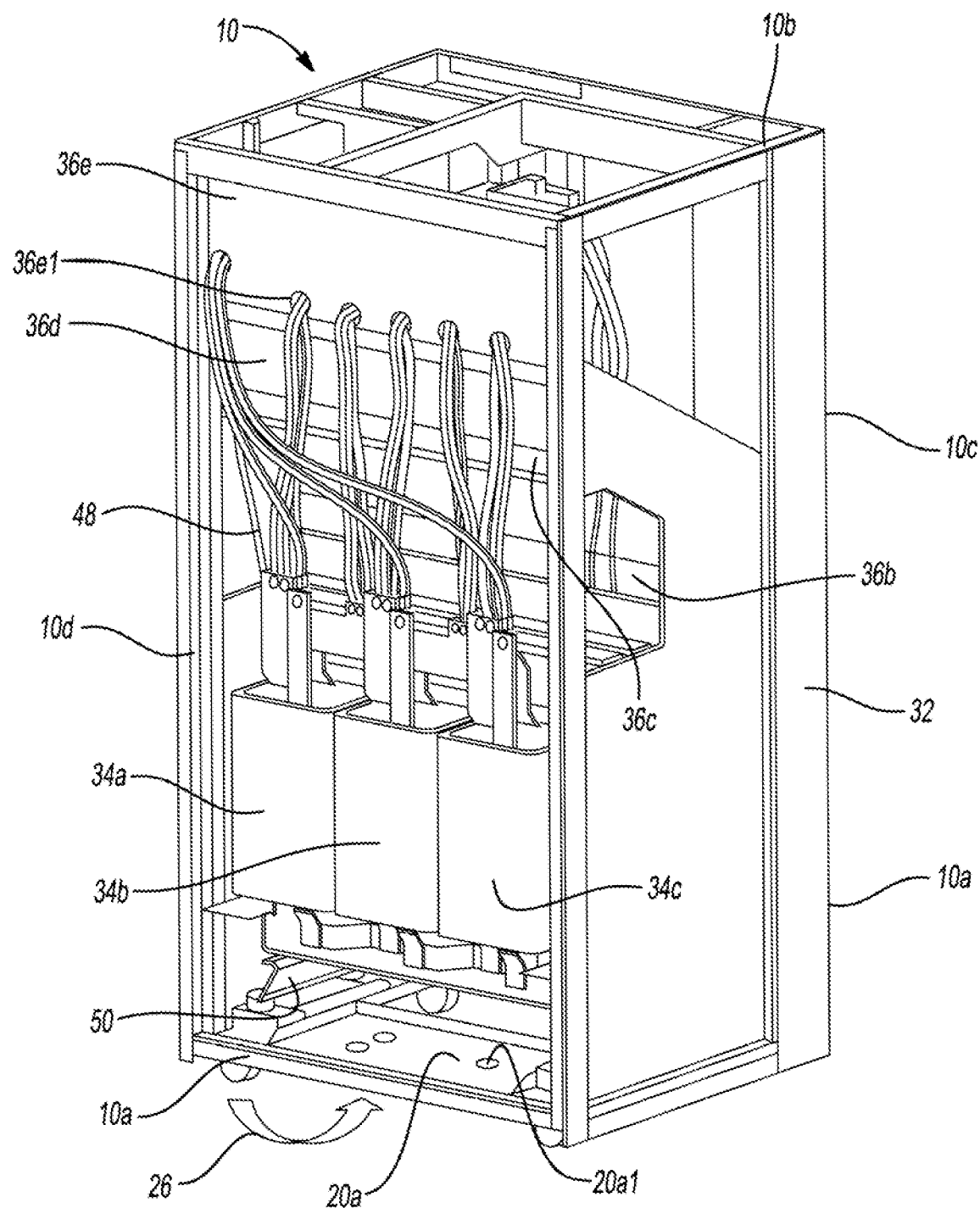
FIG. 3 is a rear perspective view of the cabinet of FIG. 1 but without the top panels, the two front doors, the side panels and the rear panel.
Figure 4:
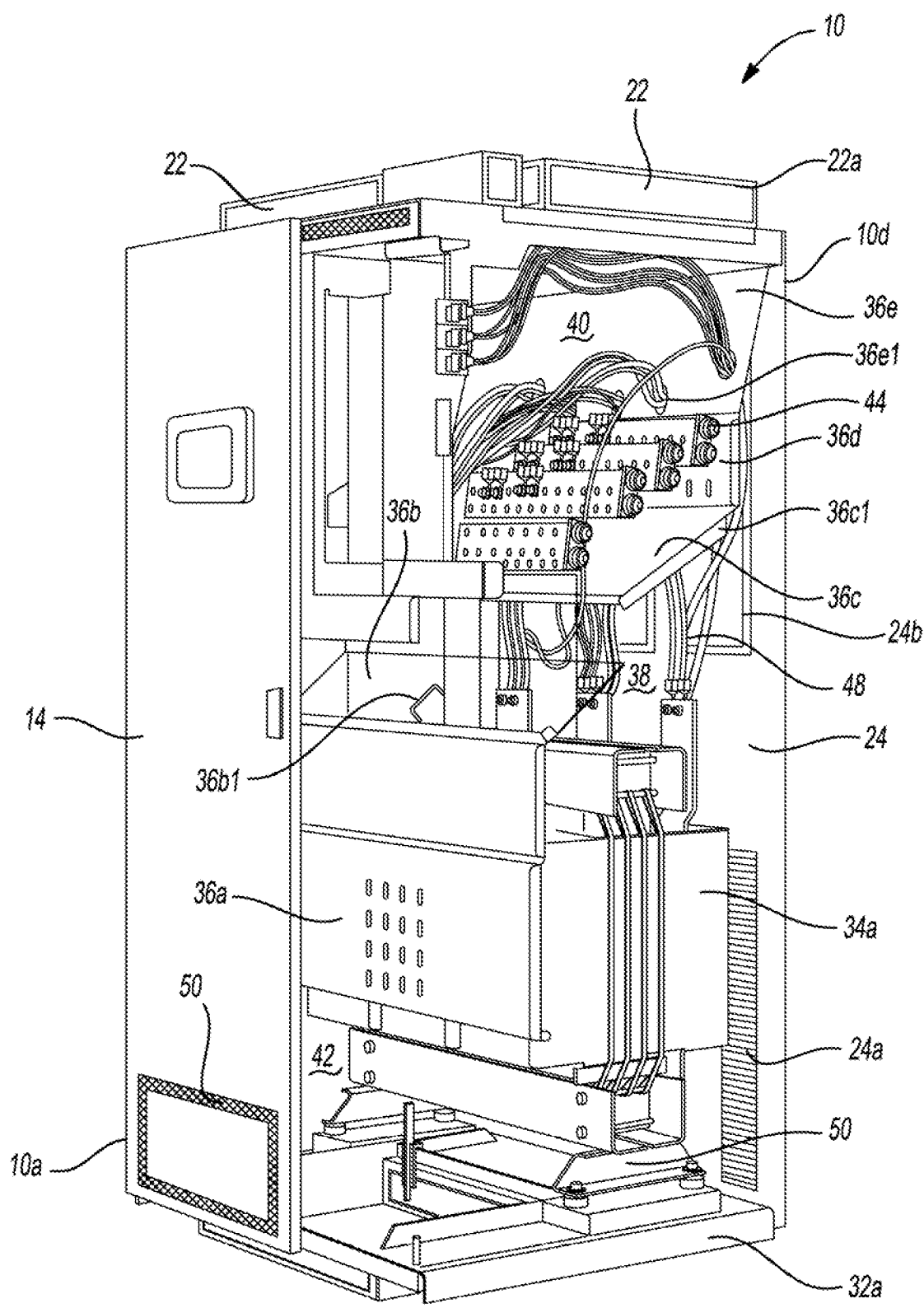
FIG. 4 is a right side angle view of the cabinet of FIG. 1 without the right hand front door and the right side panel.

FIG. 2 shows a frame 32 which helps to form the cabinet 10. The side panels 16 and 18 have been removed to better illustrate the internal components housed within the cabinet 10 as well as the various internal compartments and airflow channels formed within the cabinet. FIGS. 3 and 4 also show the cabinet 10 without the various RH and LH front doors 12 and 14 and side panels 16 and 18.

In FIGS. 2, 3 and 4 the cabinet 10 in this example can be seen to include a large power transformer 34 having three separate coils 34a, 34b and 34c, one for each phase of the received AC input mains signal. The large power transformer 34 receives AC power from the AC mains line of the building where the cabinet 10 is located and generates a significant amount of heat during operation. To keep this heat from reaching other heat-sensitive components within the cabinet 10 and to direct hot air flow upwards and toward the rear of the cabinet 10, a plurality of baffle sections 36a, 36b, 36c, 36d and 36e are used. Baffle sections 36a, 36c and 36d are secured to portions of the frame 32 and are thus fixedly secured within the cabinet 10. Baffle section 36e is connected to the upper portion of baffle section 36d and the top of the frame 12. Baffle section 36b is movable along opposing flanges 36c1 of the baffle section 36c. The baffle sections 36a-36e partition off a lower interior portion of the cabinet 10 to create a high heat compartment 38 to contain the high heat generated by the high power transformer 34 and to channel hot air flow upwards and rearwards towards the openings 24b in the rear panel 24. Importantly, baffle sections 36b, 36c and 36e are arranged at angles oblique to a bottom portion 32a of the frame 32 to help form an upper wall for the high heat compartment 38. The portions of the upper wall formed by the baffle sections 36b and 36c are arranged preferably at angles between about 30-70 degrees relative to the bottom portion 32a of the frame 32, and even more preferably at angles of between about 40-50 degrees relative to the bottom portion 32a. The portion of the upper wall formed by baffle section 36e is arranged preferably at an acute angle relative to the rear panel 24 of the cabinet 10, and in some embodiments at an angle between about 15-30 degrees relative to the rear panel 24 of the cabinet 10.

The baffle section 36b may be formed from a transparent polycarbonate material to permit visual inspection of cabling and/or components behind or beneath the baffle section 36b. A handle 36b1 on the polycarbonate baffle section 36b helps the user to slide the baffle section 36b upwardly and to the rear along the flanges 36c1, which permits physical access to the cabling and components in the lower high heat compartment 38. Baffle section 36e may include slots or openings of various shapes 36e1 to accommodate large gauge electrical cables 48. Baffle sections 36a, 36c and 36d may be formed from sheet metal and baffle section 36e may be formed of polypropylene or any other suitable lightweight, heat resistant materials.

As shown in FIGS. 2 and 4, the baffle sections 36a-36e also help to form an upper compartment 40 within the cabinet 10 interior directly above the high heat compartment 38. The baffle section 36a also helps to define a lower cool air intake compartment 42 at the lower end 10a of the cabinet. The upper compartment 40 may be used to house power distribution busbars 44 or other heat sensitive electrical/electronic components (e.g., fuses). Similarly, one or more heat sensitive power distribution circuit breakers (shown in highly schematic form by one box labelled 46) may be disposed along the front side 10c of the cabinet 10, which is also separated from the high heat compartment 38.

As shown in FIGS. 3 and 4, a plurality of large gauge electrical cables 48 may be used to couple the output of the power transformer 34 along a rear area 10d of the cabinet 10 through openings 36e1 in the baffle section 36e to different ones of the power distribution busbars 44. Various ones of the power distribution circuit breakers 46 may be coupled to designated ones of the distribution busbars 44 to create a plurality of independent electrical circuits for supplying power to other components (e.g., PDU, UPS, etc.) operably associated with the cabinet 10. A pair of angled members 50 help to support the power transformer 34 slightly above the lower end 10a of the cabinet.

Referring further to FIG. 2, during use of the cabinet 10 the cool air 26 flows into the lower end 10a of the cabinet 10 at multiple locations formed by the openings (20a1 in FIG. 3) in the bottom panel 20, through the openings 12a and 14a in the RH and LH doors 12 and 14, and through openings in the rear panel (24a in FIG. 4) of the cabinet. A portion of the cool air 26a flows along the front side 10c of the cabinet 10 and over one or more of the power distribution circuit breakers 46 before entering the upper compartment 40. However, a major portion of the cool air 26 enters the lower cool air intake compartment 42 and begins to flow up along a separate airflow path adjacent the front side of the cabinet 10, which is formed in part by the RH and LH doors 12 and 14, and over and through the coil portions 34a-34c of the high power transformer 34. The cool air 26 removes heat from the high power transformer 34 creating the hot air 28. The hot air 28 rises within the high heat compartment 38 and is then redirected by the angled baffle sections 36b and 36c laterally out through openings 24b in the rear panel 24 (FIG. 4) of the cabinet 10. A significant advantage of this design is that no exhaust fan is required, because the angles of the baffle sections 36b, 36c and 36e are such that these baffle sections perform the function of helping to redirect, or channel, the rising hot air 28 toward the rear area 10d of the cabinet 10 and out of the cabinet.

A portion 26a of the cool air 26 that enters the upper compartment 40 also flows over the busbars 44, helping to cool the busbars and any components connected thereto. This turns the cool air portion 26a into the moderately warm air flow 30. The moderately warm air flow 30 also rises and passes through the openings 22a in the top panels 22 of the cabinet 10. Again, this exhausting of the moderately warm air flow 30 occurs without the need for an exhaust fan, and without the need to reposition or reconfigure the various heat sensitive electrical/electronic components within the upper compartment 40.

It is a significant benefit that the hot air flow 28 is kept separated from the busbars 44, the power distribution circuit breakers 46 and other electrical/electronic components that are more heat sensitive, and without increasing the size of the footprint of the cabinet 10 as would be needed with a conventional cabinet design, or possibly requiring a separate cabinet altogether for just the power transformer 34. The configuration of the high heat compartment 38 directly below the upper compartment 40 of the cabinet 10 enables the cabinet to be constructed with a smaller overall footprint that what would be needed with a conventional cabinet design, and without the need for adding power consuming components such as electrical fans, which are items that create a risk of component damage if/when they fail. The cabinet 10 also eliminates the need to oversize the busbars and other components, which would otherwise be needed to ensure that these components are able to withstand the high heat generated by the power transformer 34. Furthermore, the design of the cabinet 10 enables the cabinet 10 to be constructed with less raw material costs for the frame 32 and the various panels, as well as the busbars, breakers, and other components, which collectively results in less overall weight for the cabinet 10, as compared to a conventional cabinet construction of similar capacity and footprint size. The design of the cabinet 10 further does not complicate the placement or access of any of the independent electrical/ electronic components housed within the cabinet 10, nor necessitate any complex assembly procedures for the cabinet 10 itself, or the components housed within it. An additional advantage is that the baffle sections 36a-36e prevent the high heat generated by the power transformer 34 from reaching the RH and LH front doors 12 and 14 and thus raising the temperature of these components.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. An equipment cabinet, comprising:
   a frame (32) including a bottom portion (32a);
   a plurality of exterior panels including first and second side panels (16/18), and a rear panel (24), supported from the frame in vertical orientations to help define an interior area within the equipment cabinet, the rear panel having an opening (24b) at an upper end thereof for enabling hot air (28) within the interior area of the equipment cabinet to be expelled from the equipment cabinet;
   at least one top panel (22) for covering at least a major portion of the equipment cabinet, the top panel including an opening (22a) to expel warm air (30) from within the interior area to an ambient environment outside the equipment cabinet;
   at least one front door (12 or 14) disposed along a front portion of the interior area of the equipment cabinet, the at least one front door being movable between open and closed orientations to enable access to the interior area of the equipment cabinet;
   at least one of the front door, or the bottom portion (32a) or the rear panel (34) including a cool air opening (12a, or 14a or 24a) for enabling cool air (26) to enter the interior area of the equipment cabinet and flow into a lower cool air intake compartment (42) of the equipment cabinet;
   a baffle structure (36a-36e) disposed within the interior area of the equipment cabinet, and extending laterally between the first and second side panels, the baffle structure forming a barrier that creates a high heat compartment (38) separated from an upper compartment (40) within the interior area of the equipment cabinet;
   the baffle structure (36a-36e) further configured to cooperate with the at least one front door to form a separate airflow path along the front portion of the interior area of the equipment cabinet, the separate airflow path beginning adjacent the bottom portion of the frame and leading into the upper compartment;
   the baffle structure further configured to channel the hot air (28) generated from an electrical component housed in the high heat compartment upwardly and toward the opening at the upper end of the rear panel, to be expelled through the opening at the upper end of the rear panel to the ambient environment outside the equipment cabinet; and the upper compartment operating to channel the warm air (30) created from an additional electrical component housed in the upper compartment, through the opening in the at least one top panel, to the ambient environment outside the equipment cabinet.

2. The equipment cabinet of claim 1, wherein:
the baffle structure includes at least one section (36b or 36c) angled obliquely to the bottom portion of the frame so as to extend upwardly towards the rear panel, to help channel the hot air (28) within the hot air compartment (38) upwardly toward the opening in the rear panel.

3. The equipment cabinet of claim 1, wherein:
wherein: the baffle structure is comprised of a plurality of interconnected sections, at least two of which (36b or 36c) are angled obliquely to the bottom portion of the frame.

4. The equipment cabinet of claim 2, wherein:
the bottom portion (32a) extending horizontally; and
the at least one section (36b or 36c) of the baffle structure is angled at an angle between 30 degrees and 70 degrees from the bottom portion of the frame.

5. The equipment cabinet of claim 1, wherein:
the bottom portion (32a) extending horizontally; and
the baffle structure is disposed above the bottom portion of the frame and includes at least a plurality of sections interconnected together.

6. The equipment cabinet of claim 5, wherein at least one of:
two of the plurality of sections (36b and 36c) are each arranged at angles between 30 degrees and 70 degrees relative to the bottom portion of the frame; or
at least one of the plurality of baffle sections (36e) is arranged at an angle between about 15-30 degrees relative to the rear panel 24, adjacent the upper end of the equipment cabinet.

7. The equipment cabinet of claim 5, wherein at least one of the plurality of sections (36a) of the baffle structure (36) is disposed vertically and spaced inwardly from the at least one front door (12 or 14) to create the separate airflow path for a portion of the cool air (26a) entering the equipment cabinet at the lower area thereof to flow upwardly, parallel to the high heat compartment (38), and into the upper compartment (40).

8. The equipment cabinet of claim 7, wherein the at least one (36a) of the plurality of sections of the baffle structure (36) assists in forming a lower cool air intake compartment (42) within the equipment cabinet.

9. The equipment cabinet of claim 1, wherein at least one section (36b) of the baffle structure is movable between first and second positions.

10. The equipment cabinet of claim 9, further including a pair of opposing flanges (36c1) supported within the equipment cabinet to support and enable sliding movement of the at least one section (36b) of the baffle structure.

11. The equipment cabinet of claim 1, wherein both of the first and second side panels (16 and 18) and the at least one front door each include openings at their lower areas to admit cool air into the lower cool air intake compartment (42) of the equipment cabinet.

12. The equipment cabinet of claim 1, wherein each of the front door panel (12 or 14) and the rear panel include an opening at their lower areas to admit cool air into the lower cool air intake compartment (42) of the equipment cabinet.

13. The equipment cabinet of claim 1, wherein the baffle structure includes five sections (36a-36e) arranged relative to one another to form a continuous baffle.

14. The equipment cabinet of claim 1, further including a bottom panel (20) disposed adjacent the bottom portion (32a) of the frame (32) for covering at least a portion of the lower area of the equipment cabinet.

15. The equipment cabinet of claim 1, further comprising at least one angled member (50) disposed within the equipment cabinet, and supported from the frame, for supporting the heat generating electrical component.

16. An equipment cabinet, comprising:
a frame (32);
a plurality of exterior panels including first and second side panels (16/18), and a rear panel (24), supported from the frame in vertical orientations to help define an interior area within the equipment cabinet, the rear panel having an opening (24b) at an upper end thereof for enabling hot air (28) within the interior area of the cabinet to be expelled from the cabinet;
at least one top panel 22 for covering at least a major portion of the equipment cabinet, the top panel including an opening (22a) to expel warm air (30) from within the interior area to an ambient environment outside the equipment cabinet;
at least one front door (12 or 14) movable between open and closed orientations to enable access to an interior area of the equipment cabinet;
both of the front door and the rear panel including cool air openings (12a, or 14a, and 24a) for enabling cool air (26) to enter the interior area of the equipment cabinet at a lower area of the equipment cabinet, and to flow into a lower cool air intake compartment (42); and
a baffle structure (36a-36e) disposed within the interior area of the equipment cabinet, and extending laterally between the first and second side panels, the baffle structure including at least one section operating to form a barrier that creates a high heat compartment (38) separated from an upper compartment (40) within the interior area of the equipment cabinet, as well as to help form the lower cool air intake compartment (42) at the lower area of the equipment cabinet, below the high heat compartment, from which cool air (26) is able to enter the high heat compartment at the lower area of the equipment cabinet, and from which cool air (26a) is able to flow upwardly into the upper compartment (40);
the baffle structure further configured to channel the hot air (28) generated from an electrical component (34) housed in the high heat compartment (38) upwardly and toward the opening at the upper end of the rear panel, to be expelled through the opening at the upper end of the rear panel to the ambient environment outside the equipment cabinet; and
the upper compartment (40) operating to channel the warm air (30) created from an additional electrical component (44) housed in the upper compartment, through the opening in the at least one top panel, to the ambient environment outside the equipment cabinet.

17. The equipment cabinet of claim 16, wherein:
the frame includes a horizontally extending bottom portion (32a); and
the baffle structure includes at least one section that is angled between 30 degrees to 70 degrees relative to the horizontally extending bottom portion.

18. The equipment cabinet of claim 17, wherein the baffle structure includes a plurality of sections (36b and 36c) that each extend at an angle oblique to the bottom portion of the frame.

19. The equipment cabinet of claim 17, wherein the baffle structure includes a plurality of baffle sections (36a-36e) arranged to form a generally continuous baffle structure, and wherein at least one of the baffle sections (36b) is movable to enable access to the high heat compartment (38) from a front side of the equipment cabinet when the at least one front door is open.

20. A method for forming an equipment cabinet, the method comprising:
providing a frame (32) having a bottom portion (32a);
using a plurality of exterior panels including first and second side panels (16/18), and a rear panel (24), supported from the frame in vertical orientations, to help define an interior area within the equipment cabinet, the rear panel having an opening (24b) at an upper end thereof for enabling hot air (28) within the interior area of the equipment cabinet to be expelled from the equipment cabinet;
using at least one top panel (22) to cover at least a major portion of the equipment cabinet, and providing the top panel with an opening (22a) to expel warm air (30) from within the interior area to an ambient environment outside the equipment cabinet;
disposing at least one front door (12 or 14) from the frame which is movable between open and closed orientations to enable access to an interior area of the equipment cabinet, and where the front door is disposed along a front portion of the interior area of the equipment cabinet;
providing at least one of the front door panel, or the bottom portion or the rear panel with a cool air opening (12a, or 14a or 24a) for enabling cool air (26) to enter a lower cool air intake compartment area (42) within the equipment cabinet;
disposing a baffle structure (36a-36e) within the interior area of the equipment cabinet, and such that the baffle structure extends laterally between the first and second side panels, and providing the baffle structure with at least one section operating to form a barrier that creates a high heat compartment (38) separated from an upper compartment (40) within the interior area of the equipment cabinet, and further such that the baffle structure cooperates with the at least one front door to form a separate airflow path along the front portion of the interior area of the equipment cabinet, the separate airflow path beginning adjacent the bottom portion of the frame and leading into the upper compartment;
further configuring the baffle structure to channel the hot air (28) generated from an electrical component housed in the high heat compartment upwardly and toward the opening at the upper end of the rear panel, to be expelled through the opening at the upper end of the rear panel to the ambient environment outside the equipment cabinet; and
further configuring the upper compartment (40) to channel the warm air (30) created from an additional electrical component housed in the upper compartment, through the opening in the at least one top panel, to the ambient environment outside the equipment cabinet.

21. An equipment cabinet, comprising: a frame (32) including a bottom portion (32a); a plurality of exterior panels including first and second side panels (16/18), and a rear panel (24), supported from the frame in vertical orientations to help define an interior area within the equipment cabinet, the rear panel having an opening (24b) at an upper end thereof for enabling hot air (28) within the interior area of the equipment cabinet to be expelled from the equipment cabinet; at least one top panel (22) for covering at least a major portion of the equipment cabinet, the top panel including an opening (22a) to expel warm air (30) from within the interior area to an ambient environment outside the equipment cabinet; at least one front door (12 or 14) movable between open and closed orientations to enable access to the interior area of the equipment cabinet; at least one of the front door or the bottom portion (32a) or the rear panel (34) including a cool air opening (12a, or 14a or 24a) for enabling cool air (26) to enter the interior area of the equipment cabinet and flow into a lower cool air intake compartment (42) of the equipment cabinet; a multi-section baffle structure (36a-36e) disposed within the interior area of the equipment cabinet, and extending laterally between the first and second side panels, the baffle structure forming a barrier that creates a high heat compartment (38) separated from an upper compartment (40) within the interior area of the equipment cabinet, wherein at least one section (36b) of the multi-section baffle structure is movable between first and second positions; a pair of opposing flanges (36c1) supported within the equipment cabinet to support and enable sliding movement of the at least one section (36b) of the baffle section; the baffle structure further configured to channel the hot air (28) generated from an electrical component housed in the high heat compartment upwardly and toward the opening at the upper end of the rear panel, to be expelled through the opening at the upper end of the rear panel to the ambient environment outside the equipment cabinet, the upper compartment operating to channel the warm air (30) created from an additional electrical component housed in the upper compartment, through the opening in the at least one top panel, to the ambient environment outside the equipment cabinet.

* * * * *